US012588421B2

(12) United States Patent
van der Straten et al.

(10) Patent No.: US 12,588,421 B2
(45) Date of Patent: Mar. 24, 2026

(54) MEMORY ELEMENT WITH A HARDMASK STACK HAVING DIFFERENT STRESS LEVELS

(71) Applicant: International Business Machines Corporation, Armonk, NY (US)

(72) Inventors: Oscar van der Straten, Guilderland Center, NY (US); Lisamarie White, Staatsburg, NY (US); Willie Lester Muchrison, Jr., Troy, NY (US); Scott A. DeVries, Albany, NY (US); Daniel Charles Edelstein, White Plains, NY (US); Michael Rizzolo, Delmar, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 792 days.

(21) Appl. No.: 17/548,828

(22) Filed: Dec. 13, 2021

(65) Prior Publication Data

US 2023/0189655 A1      Jun. 15, 2023

(51) Int. Cl.
*H10N 50/01* (2023.01)
*H10B 61/00* (2023.01)
*H10N 50/80* (2023.01)

(52) U.S. Cl.
CPC ............. *H10N 50/01* (2023.02); *H10B 61/00* (2023.02); *H10N 50/80* (2023.02)

(58) Field of Classification Search
CPC ........ H10N 50/10; H10N 50/01; H10N 50/80;

H10N 50/85; H10N 70/063; H10N 70/8413; H10N 70/231; H10B 61/00; H10B 61/22; H10B 63/10; H01F 41/307; H01F 41/34; H01F 10/30; H01F 10/3254; G11C 11/161; G11B 5/3909; G11B 5/4826; G11B 19/2009; G11B 5/6082; H01L 21/0337; H01L 21/0332
See application file for complete search history.

(56) References Cited

U.S. PATENT DOCUMENTS

| | | | |
|---|---|---|---|
| 8,125,040 B2 | 2/2012 | Kang et al. | |
| 9,269,893 B2 | 2/2016 | Lu et al. | |
| 10,522,750 B2 | 12/2019 | Yang et al. | |
| 10,529,919 B2 | 1/2020 | Cho et al. | |
| 11,088,201 B2 | 8/2021 | Lin et al. | |
| 11,088,320 B2 | 8/2021 | Yang et al. | |
| 2004/0145850 A1* | 7/2004 | Fukumoto | B82Y 25/00 |
| | | | 361/143 |
| 2008/0164548 A1* | 7/2008 | Ranjan | G11C 11/5607 |
| | | | 257/E29.323 |

(Continued)

FOREIGN PATENT DOCUMENTS

CN          105470275 B      11/2019

*Primary Examiner* — Mouloucoulaye Inoussa
(74) *Attorney, Agent, or Firm* — CANTOR COLBURN LLP; L. Jeffrey Kelly

(57) ABSTRACT

Embodiments of the invention are directed to an integrated circuit (IC) structure that includes a memory element a non-sacrificial hardmask stack over the memory element. The non-sacrificial hardmask stack includes a first hardmask region and a second hardmask region. A compressive stress level of the first hardmask region is greater than a compressive stress level of the second hardmask region.

20 Claims, 9 Drawing Sheets

(56)         References Cited

U.S. PATENT DOCUMENTS

| | | | |
|---|---|---|---|
| 2009/0209050 A1* | 8/2009 | Wang ................... | G11C 11/161 |
| | | | 257/E21.001 |
| 2011/0298070 A1* | 12/2011 | Fukui ................... | H10N 50/10 |
| | | | 257/422 |
| 2012/0028373 A1 | 2/2012 | Belen et al. | |
| 2013/0010529 A1* | 1/2013 | Hayakawa ............ | H10N 70/24 |
| | | | 257/E45.001 |
| 2013/0062714 A1* | 3/2013 | Zhu ...................... | G11C 11/161 |
| | | | 257/E29.323 |
| 2018/0287050 A1* | 10/2018 | Madras ............... | H01F 10/3286 |
| 2019/0036014 A1* | 1/2019 | Ha ........................ | H10N 50/10 |
| 2019/0326354 A1* | 10/2019 | Seo ...................... | H10B 61/00 |
| 2019/0393410 A1* | 12/2019 | Lee ...................... | H10B 61/10 |
| 2020/0052196 A1 | 2/2020 | Shen et al. | |
| 2020/0075844 A1* | 3/2020 | Haq ................... | G11B 19/2009 |
| 2020/0106009 A1* | 4/2020 | Wu ....................... | H10N 50/01 |
| 2020/0126791 A1* | 4/2020 | Rizzolo .............. | H01L 21/0337 |
| 2021/0159394 A1* | 5/2021 | Rizzolo ................ | H10N 50/85 |

* cited by examiner

MEMORY ELEMENT WITH A HARDMASK STACK HAVING DIFFERENT STRESS LEVELS

BACKGROUND

The present invention relates in general to fabrication methodologies and resulting structures for integrated circuit (IC) wafers. More specifically, the present invention relates to fabrication methodologies and resulting structures for forming a memory element with a hardmask stack configured and arranged to include different stress levels.

ICs are fabricated in a series of stages, including front-end-of-line (FEOL) stages, middle-of-line (MOL) stages and back-end-of-line (BEOL) stages. The process flows for fabricating modern ICs are often identified based on whether the process flows fall in the FEOL stages, the MOL stages, or the BEOL stages. Generally, the FEOL stages are where device elements (e.g., transistors, capacitors, resistors, etc.) are patterned in the semiconductor substrate/wafer. The FEOL stages (or logical layers) include wafer preparation, isolation, and gate patterning, along with the formation of wells, source/drain (S/D) regions, extension junctions, silicide regions, and liners. The MOL stages (or functional layers) typically include process flows for forming the contacts and other structures that couple to active regions (e.g., gate/source/drain) of the FEOL device elements. Networks of interconnect structures (e.g., conductive lines and vias) are formed above these logical and functional layers during the BEOL stage to complete the IC.

Magnetic random access memory (MRAM) can be formed from memory elements or structures such as magnetic tunnel junction (MTJ) stacks, which can be embedded in BEOL interconnect structures. The MTJ stack can be formed by using a relatively thick and patterned hardmask to define the footprint of the MTJ stack.

SUMMARY

Embodiments of the invention are directed to an integrated circuit (IC) structure that includes a memory element and a non-sacrificial hardmask stack over the memory element. The non-sacrificial hardmask stack includes a first hardmask region and a second hardmask region. A compressive stress level of the first hardmask region is greater than a compressive stress level of the second hardmask region.

Embodiments of the invention are directed to an IC structure that includes a memory element and a non-sacrificial hardmask stack over the memory element. The non-sacrificial hardmask stack includes a plurality of first hardmask regions and a plurality of second hardmask regions. Each of the plurality of first hardmask regions is adjacent to one of the plurality of second hardmask regions. A compressive stress level of each of the plurality of first hardmask regions is greater than a compressive stress level of each of the plurality of second hardmask regions.

Embodiments of the invention are directed to a method of forming a portion of an IC structure. The method includes forming a memory element and forming a non-sacrificial hardmask stack over the memory element. The non-sacrificial hardmask stack includes a first hardmask region and a second hardmask region. A compressive stress level of the first hardmask region is greater than a compressive stress level of the second hardmask region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-11B depict cross-sectional views of a portion of an IC structure after fabrication operations for forming the IC structure depicted in FIG. 1A and/or the IC structure depicted in FIG. 1B in accordance with embodiments of the invention, in which:

FIG. 2 depicts a cross-sectional view of the IC structure after fabrication operations according to embodiments of the invention;

FIG. 3 depicts a cross-sectional view of the IC structure after fabrication operations according to embodiments of the invention;

FIG. 4 depicts a cross-sectional view of the IC structure after fabrication operations according to embodiments of the invention;

FIG. 5 depicts a cross-sectional view of the IC structure after fabrication operations according to embodiments of the invention;

FIG. 6 depicts a cross-sectional view of the IC structure after fabrication operations according to embodiments of the invention;

FIG. 7 depicts a cross-sectional view of the IC structure after fabrication operations according to embodiments of the invention;

FIG. 8 depicts a cross-sectional view of the IC structure after fabrication operations according to embodiments of the invention;

FIG. 11B depicts a cross-sectional view of the IC structure after fabrication operations for forming the IC structure shown in FIG. 1B according to embodiments of the invention.

DETAILED DESCRIPTION

Figures 1A, 1B:
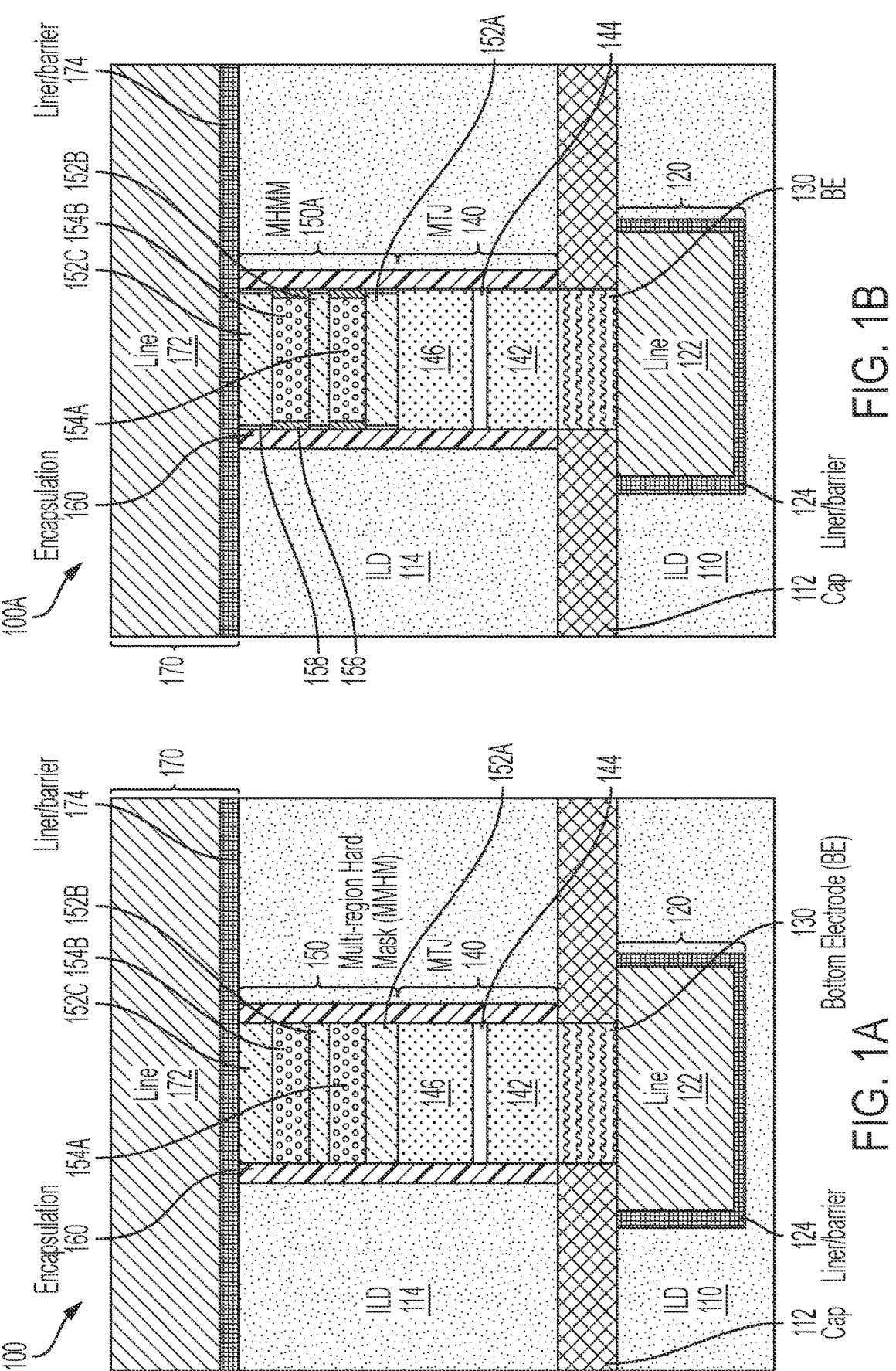
FIG. 1A depicts a cross-sectional view of a portion of an IC structure that includes a memory element with a multi-region metal hardmask (MMHM) stack having different stress levels in accordance with embodiments of the invention.
FIG. 1B depicts a cross-sectional view of a portion of an IC structure that includes a memory element with a hardmask stack having different stress levels and a protective dielectric layer in accordance with embodiments of the invention.

It is understood in advance that, although this description includes a detailed description of the formation and resulting structures for a specific type of memory element (i.e., an embedded MTJ stack), implementation of the teachings recited herein are not limited to the particular type of embedded memory element or IC architecture described herein. Rather embodiments of the present invention are capable of being implemented in conjunction with any other type of memory element or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, MRAM is a non-volatile memory that combines a magnetic device with standard silicon-based microelectronics to achieve the combined attributes of non-volatility, high-speed read/write operations, high read/write endurance and data retention. A popular type of MRAM is based on the magnetoresistive effect, whereby a change to certain magnetic states of the MRAM storage element (or "bit") results in a change to the storage element's resistance. The main MRAM storage element is known as a magnetic tunnel junction (MTJ) storage element or memory element. A basic MTJ stack includes a free layer and a fixed/reference layer, each of which includes a magnetic material. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

As previously described herein, MTJ stacks can be embedded in interconnect structures of the IC. Typically, the interconnect structures include wires and vias. For a variety of reasons, it is desirable to not place the MTJ stack directly on an interconnect structure of the IC. In general, the MTJ is a somewhat fragile element that must be carefully interfaced with other IC structures. For example, the wires and vias that form the interconnect structures are typically formed from copper and/or cobalt. Cobalt is a magnetic material, and copper is known to diffuse easily during IC fabrication operations. Accordingly, in order to minimize the potential for the magnetic and diffusion properties of cobalt and copper, respectively, to interfere with operation of the MTJ stack, the MTJ stack is typically coupled to the interconnect structures through newly deposited top and bottom contacts/electrodes (e.g., TiN (titanium nitride) or TaN (tantalum nitride), or ruthenium (Ru)).

In known MRAM fabrication operations, the MTJ stack can be fabricated by depositing bulk layers of the MTJ stack then using a relatively thick and patterned hardmask to remove portions of the bulk layers of the MTJ stack not covered by the hardmask, thereby defining the footprint of the MTJ stack. The subtractive fabrication process used to remove the portions of the bulk layers of the MTJ stack not covered by the hardmask require the use of a very thick hardmask. Additionally, the hardmask used to define the MTJ stack footprint must be conductive and is typically formed from a heavy conductive metal such as TaN. While heavy conductive metals such as TaN provide technical benefits when used as a non-sacrificial hardmask, such heavy conductive metals result in the non-sacrificial hardmask having a significant level of compressive stress, which can cause the non-sacrificial hardmask to bow. In some instances, bowing in the non-sacrificial hardmask can be imparted to the underlying MTJ stack and other wafer elements. The bowing of the non-sacrificial hardmask, the underlying MTJ stack, and/or other wafer elements can lead to misalignment issues, overlay issues, and even wafer breaks during MRAM/MTJ lithography and patterning steps.

Additionally, in known MRAM fabrication operations, the processes (e.g., ion beam etch (IBE)) to remove portions of the bulk layers of the MTJ stack not covered by the relatively thick non-sacrificial hardmask present challenges because they can impact the non-sacrificial hardmask and cause re-sputtering of metal from non-sacrificial hardmask onto sidewalls of the MTJ stack, which increases the potential for short circuits.

Turning now to an overview of aspects of the present invention, embodiments of the invention address the shortcomings of the prior art by providing fabrication methodologies and resulting structures for forming a memory element with a relatively thick, non-sacrificial hardmask stack configured and arranged to include different stress levels. In embodiments of the invention, the memory element can be an MTJ stack, and the non-sacrificial hardmask stack can be a multi-region metal hardmask (MMHM) stack configured to include an alternating stack of metal nitride and metal regions or layers. The MMHM stack is non-sacrificial in that it is not removed after the MTJ stack has been formed. Accordingly, the MMHM stack is conductive and formed from a relatively thick and heavy conductive metal. In accordance with aspects of the invention, the metal nitride has a first compressive stress, the metal has a second compressive stress, and the first compressive stress is greater than the second compressive stress. In accordance with aspects of the invention, the combination of metal layers at the second compressive stress with the metal nitride layers at the first compressive stress results in a total combined compressive stress that is less than the first compressive stress acting alone. In embodiments of the invention, the metal nitride can be TaN, and the metal can be Ta. In accordance with some embodiments of the invention, each alternating layer has a minimum layer thickness of about 2 nm. In some embodiments of the invention, the metal and the metal nitride materials can be formed in the same deposition chamber (e.g. by physical vapor deposition (PVD) with alternating Ar vs $Ar/N_2$ gas mixtures; or by chemical vapor deposition (CVD) with alternating reactive gases ($NH_3$, $H_2$)). The metal/metal-nitride can include Ta/TaN as well as other material combinations such as W/WN, Nb/NbN, and/or Mo/MoN. In some embodiments of the invention, the MMHM stack includes a layer of protective dielectric that prevents metal of the MMHM stack from being re-sputtered onto sidewall of the MTJ stack during fabrication (i.e., metal etching) of the MTJ bulk material to form the MTJ stack. The re-sputtered material on sidewalls of the MTJ stack can result in unwanted short circuits between the free layer and the fixed layer of the MTJ stack.

Turning now to a more detailed description of example embodiments of the invention, FIG. 1A depicts a portion of an IC 100 in accordance with the aspects of this invention. The depicted portion of the IC 100 is a back-end-of-line (BEOL) region of the IC 100 in which an MTJ stack 140 and an MMHM stack 150 are over a bottom electrode 130. Encapsulation layers 160 are formed on the sidewalls of the MTJ stack 140 and the MMHM stack 150.

The MTJ stack 140 can function as the main storage/memory element of an MRAM. The MTJ stack 140 includes a free layer 142 and a fixed/reference layer 146, each of which includes a magnetic material. The free and reference layers 142, 146 are separated by a non-magnetic insulating tunnel barrier 144. The free layer 142 and the reference layer 146 are magnetically de-coupled by the tunnel barrier 144. The free layer 142 has a variable magnetization direction, and the reference layer 146 has an invariable magnetization direction. A wide variety of layers and elements (e.g., an MTJ cap, multiple free/reference layers, etc.) (not shown) can be included in the MTJ stack 140.

The MMHM stack 150, the MTJ stack 140, the bottom electrode 130, and the encapsulation layer 160 form an MRAM (or MTJ) pillar 150, 140, 130, 160 that is electrically coupled to an interconnect 170 and an interconnect 120. The interconnect 170 includes a line 172 surrounded by a liner/barrier 174. The interconnect 120 includes a line 122 surrounded by a liner/barrier 124. The lines 172, 122 can be conductive metals that route current to and from the MRAM pillar 150, 140, 130. The liners/barriers 174, 124 are configured to serve multiple functions. For example, the liners/barriers 174, 124 can function as a barrier to prevent metals in the interconnects 170, 120 from migrating into a surrounding interlayer dielectric (ILD) 114, 110. Additionally, the liners/barriers 174, 124 can provide adhesion between the metals in the interconnects 170, 120 and the surrounding ILD 114, 110. A cap layer 112 extends over a portion of the interconnect 120 and the ILD 110. In embodiments of the invention, the cap layer 112 can be a dielectric material. In some embodiments of the invention, the cap layer 112 can be a different dielectric material than the ILD 114, 110.

In some embodiments of the invention, the lines 172, 122 can be copper (Cu), cobalt (Co), tungsten (W), or any other suitable conductive material. The liners/barriers 174, 124 can be titanium nitride (TiN), tantalum nitride (TaN), ruthenium (Ru), hafnium nitride (HfN), niobium nitride (NbN), tungsten nitride (WN), tungsten carbon nitride (WCN), or combinations thereof. The ILD 114, 110 can be formed from a low-k dielectric (e.g., k less than about 4), an ultra-low-k (ULK) dielectric (e.g., k less than about 2.5), tetraethoxysilane (TEOS), and the like, or any suitable combination of those materials. The bottom electrode 130 can be formed from a variety of conductive materials including, for example, Ta, TaN, Ti, TiN, W, WN, and Ru. The encapsulation layer 160 can be formed from any suitable dielectric materials (e.g., silicon nitride), which can include other elements such as Si, C, N, O, and the like. The cap layer 112 can be any suitable dielectric such as SiN. In embodiments of the invention, the cap layer 112 is a denser dielectric than the ILDs 114, 110.

In accordance with aspects of the invention, the MMHM stack 150 is non-sacrificial and includes multiple MMHM regions 152A, 154A, 152B, 154B, 152C that have different compressive stress levels. In accordance with aspects of the invention, the MMHM regions 152A, 152B, 152C each include a first compressive stress level, and the MMHM regions 154A, 154B each include a second compressive stress level that is less than the first compressive stress level. In accordance with aspects of the invention, the MMHM region 154A is adjacent the MMHM region 152A, which means that the MMHM region 154A at the second compressive stress level has a subtractive effect on the first compressive stress level of the MMHM region 152A. Accordingly, the first compressive stress level of the MMHM region 152A operating alone is greater than the compressive stress level of the combined MMHM 152A, 154A in which the MMHM region 154A is formed directly on the MMHM region 152A. In accordance with aspects of the invention, the MMHM regions 152A, 152B, 152C alternate with the MMHM regions 154A, 154B such that each of the MMHM regions 152A, 152B, 152C is adjacent to at least one of the MMHM regions 154A, 154B.

In accordance with aspects of the invention, various parameters of the MMHM stack 150 are tuned in order to provide a non-sacrificial hardmask having the thickness and operational properties required by the MTJ stack 140, along with a suitably low compressive stress level in the MMHM stack 150 that avoids the problems associated with known non-sacrificial hardmasks that do not have the different stress levels (e.g., the first stress level and the second stress level) provided by the MMHM regions 152A, 154A, 152B, 154B, 154C. For example, in some embodiments of the invention, the MMHM regions 152A, 152B, 152C can be formed from TaN, and the MMHM regions 154A, 154B can be formed from Ta. Because the compressive stress of Ta is about 50-70 percent of the compressive stress of TaN, the second compressive stress level is about 50-70 percent of the first compressive stress level. The thicknesses and the total number of the MMHM regions (e.g., 152A, 154A, 152B, 154B, 152C) are selected such that a desired percentage of the total volume of the MMHM stack 150 is provided by Ta at the second compressive stress level. The desired percentage of the total volume of the MMHM stack 150 that is provided by Ta at the second compressive stress level is selected to achieve a desired reduction in the first compressive stress level, as well as to achieve a desired overall compressive stress level of the MMHM stack 150. The thickness of the overall MMHM stack 150 is selected to provide the hardmask features that are necessary for forming the MTJ stack 140 from the bulk MTJ layer 302, 304, 306 (shown in FIG. 3).

FIG. 1B depicts a portion of an IC 100A in accordance with aspects of the invention. The IC 100A is substantially identical to the IC 100 (shown in FIG. 1A) except the IC 100A includes an MMHM stack 150A. The MMHM stack 150A is substantially the same as the MMHM stack 150 (shown in FIG. 1A) except the MMHM stack 150A includes protective dielectric regions 156, 158 formed on sidewalls of the MMHM stack 150A. More specifically, the protective dielectric regions 156 are formed on sidewalls of the MMHM regions 154A, 154B; and the protective dielectric regions 158 are formed on the MMHM regions 152A, 152B, 154C. In some embodiments of the invention, the protective dielectric regions 156, 158 are formed by oxidizing side-walls of the MMHM regions 152A, 154A, 152B, 154B, 154C, thereby forming each of the protective dielectric regions 156, 158 as an oxide. For example, where the MMHM regions 152A, 152B, 154C are TaN, the protective dielectric regions 158 can be TaO$_x$N. Similarly, where the MMHM regions 154A, 154B are Ta, the protective dielectric regions 156 can be TaO$_x$. In accordance with aspects of the invention, the protective dielectric regions 156, 158 prevent metal from being re-sputtered from the MMHM stack 150A onto sidewalls of the MTJ stack 140 when the MTJ stack 140 is being formed from bulk MTJ layers 302, 304, 306 (shown in FIGS. 9B and 10B).

FIGS. 2-11B depicts cross-sectional views of portions of an IC 100 after fabrication operations for forming the ICs 100, 100A depicted in FIG. 1A and FIG. 1B in accordance with embodiments of the invention. The ICs 100, 100A are depicted in two-dimensions (2D) extending along the y-axis and the x-axis (shown in FIG. 2). However, it is understood that the ICs 100, 100A are three-dimensional structures and the various features of the ICs 100, 100A also extends along the z-axis (shown in FIG. 2). Accordingly, any descriptions provided herein with reference to dimensions of the ICs 100, 100A that extend along the x-axis and the y-axis also include the corresponding dimension(s) that extends along the z-axis. The specifics of the dimension(s) that extends along the z-axis will depend on the type of feature. For example, the MTJ stack 140 can have any suitable shape (e.g., circular, square, rectangular, etc.) in a top-down z/y axis view. The shape of the interconnects 170, 120 in the top-down z/y axis view will depend on the line pattern provided by the IC design of the ICs 100, 100A.

Figure 2:
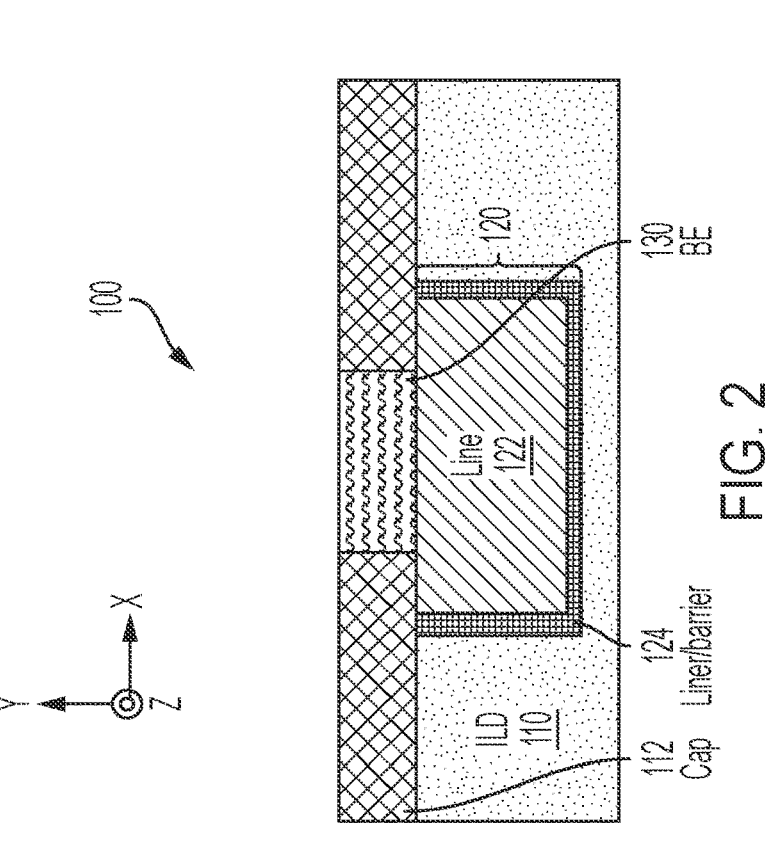
Figure 5:
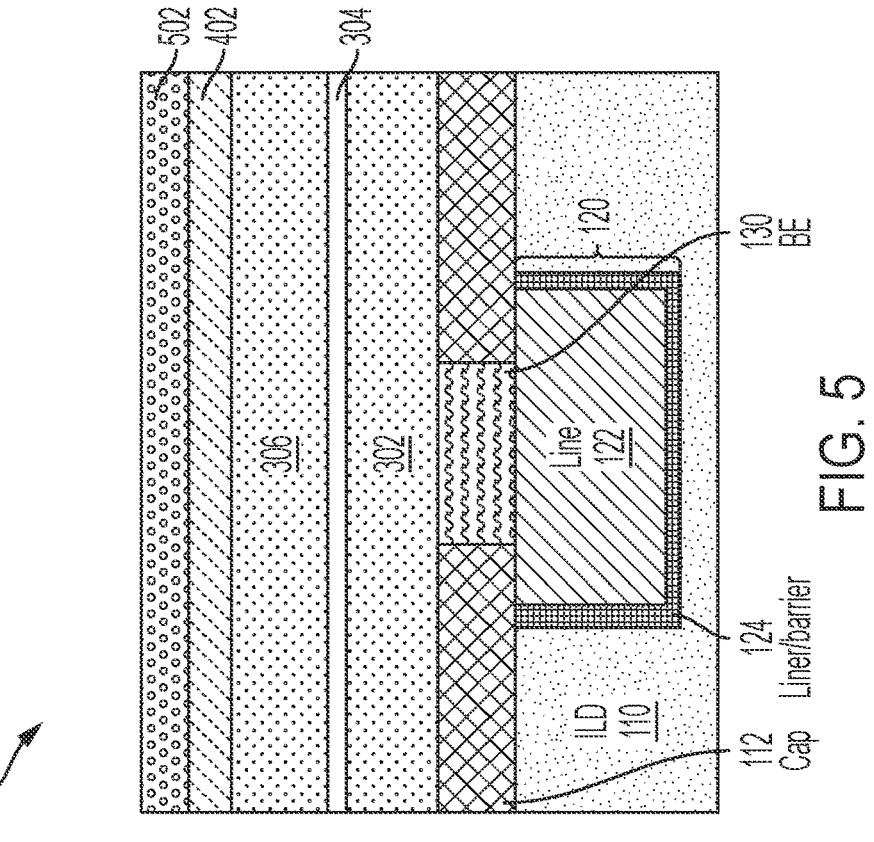
Figure 4:
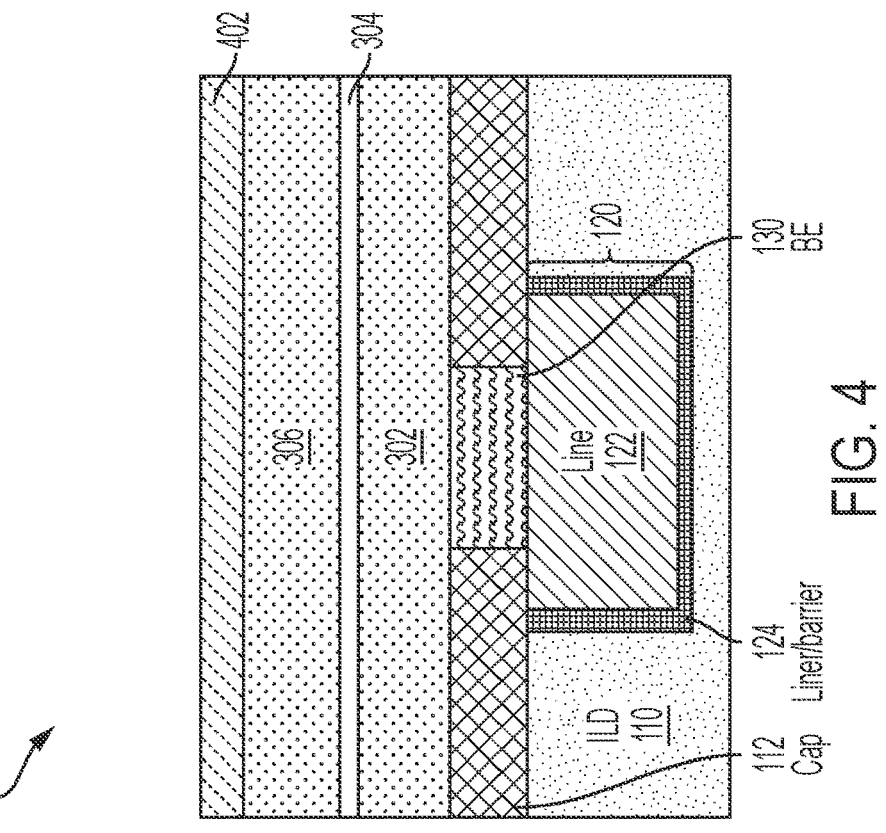
Figure 7:
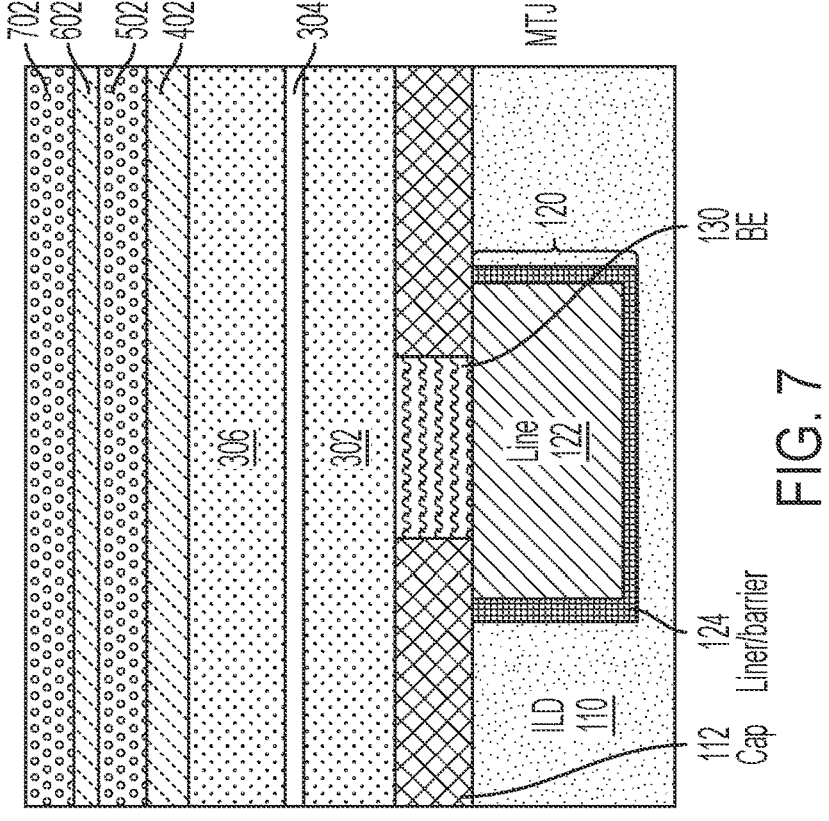
Figure 6:
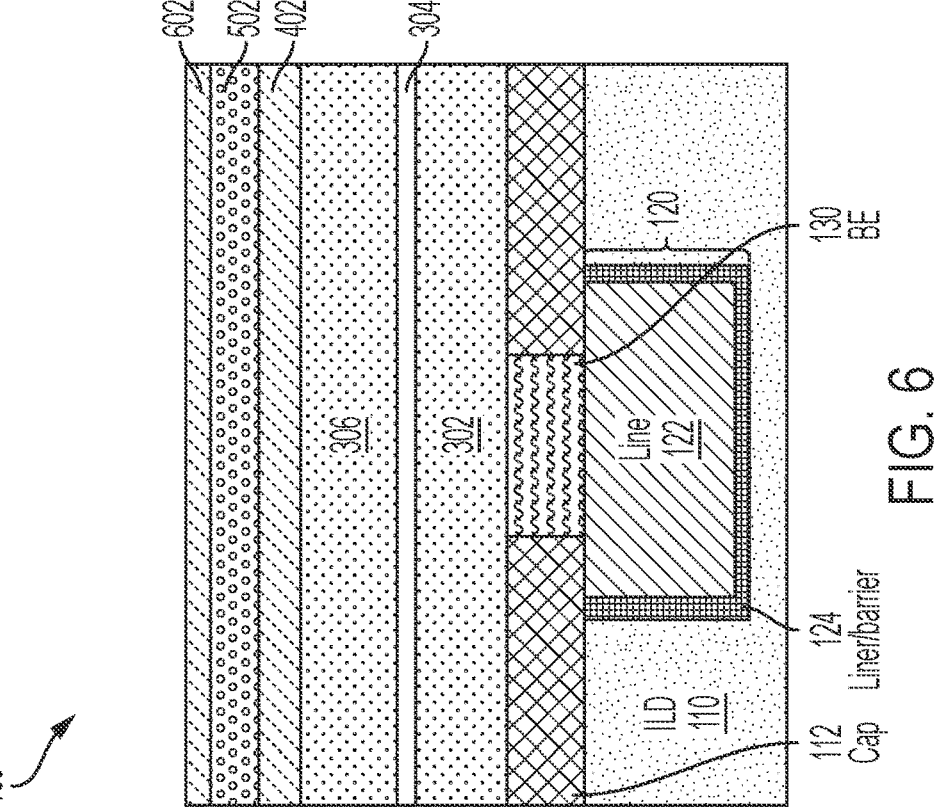
Figure 8:
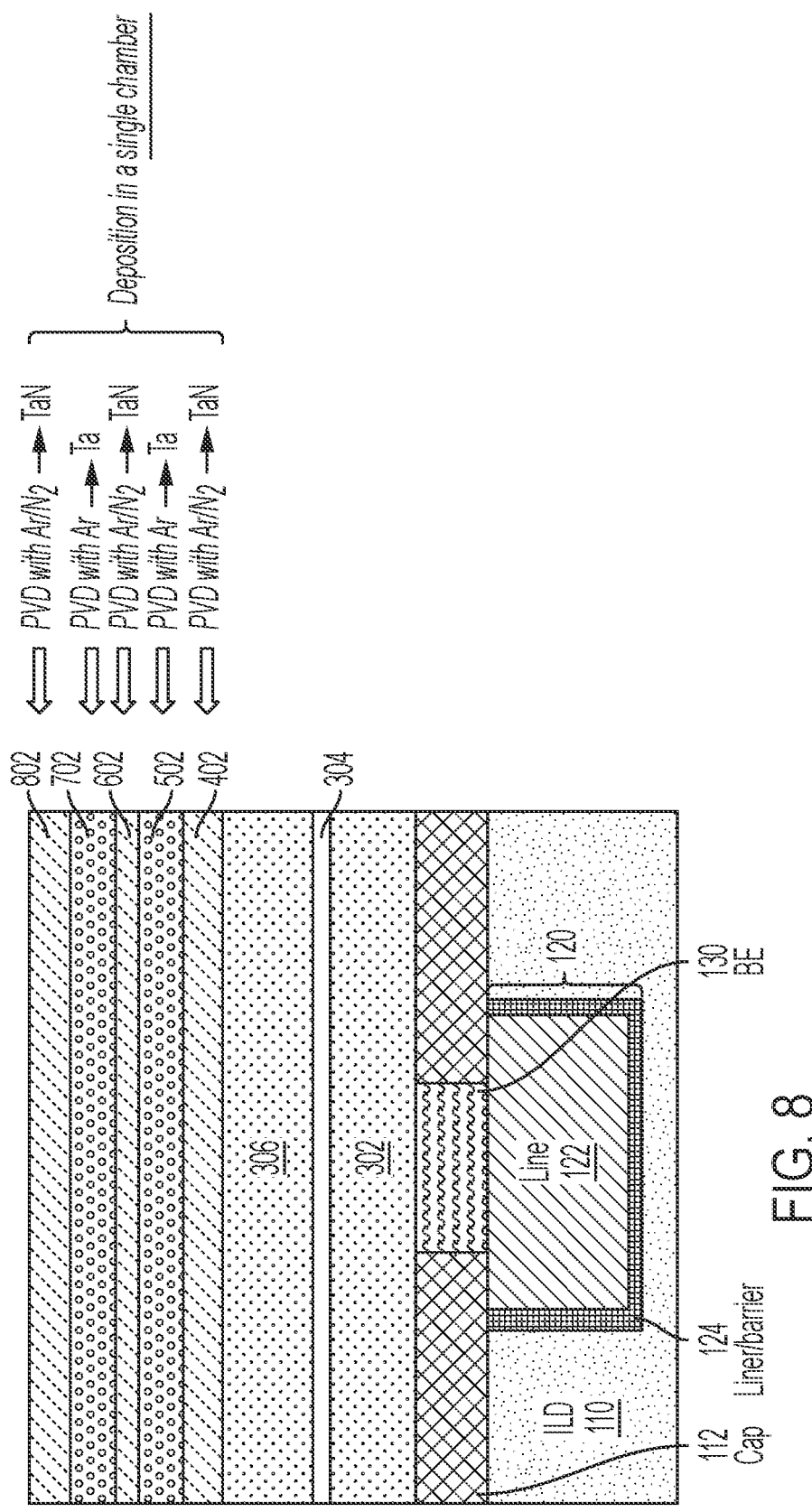

In FIG. 2, known fabrication operations have been used to form the ILD 110 having the interconnect 120 formed therein. The cap layer 112 has been formed over the ILD 110 and the interconnect 120, and the bottom electrode 130 has been embedded within the cap layer 112 and over the line 122 of the interconnect 120.

Figure 3:
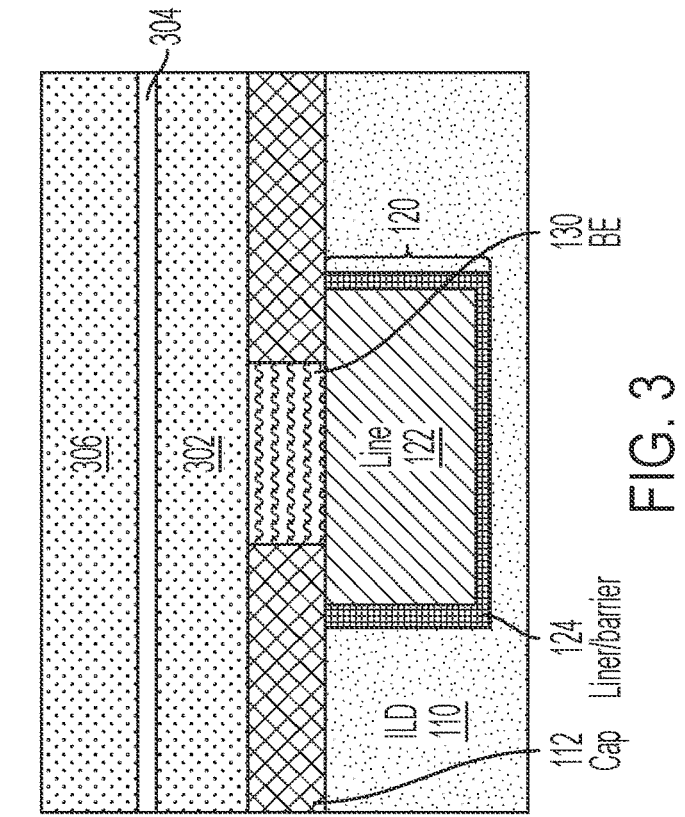

In FIG. 3, known semiconductor fabrication operations have been used to deposit the MTJ stack bulk layers 302, 304, 306 over the bottom electrode 130 and the cap layer 112.

In FIGS. 4-8, instead of depositing a thick single-material bulk hardmask having a relatively high compressive stress, in accordance with aspects of the invention, MMHM stack bulk layers 402, 502, 602, 702, 802 are deposited over the MTJ stack bulk layer 306. In accordance with aspects of the invention, the MMHM stack bulk layers 402, 502, 602, 702, 802 can each be deposited over the MTJ stack bulk layer 306 by inserting the IC 100 (at the fabrication stage shown in FIG. 4) into a single deposition chamber; using a first reactive gas configured to facilitate depositing the MMHM stack bulk layer 402; switching from the first reactive gas to a second reactive gas configured to facilitate depositing the MMHM stack bulk layer 502; switching from the second reactive gas to the first reactive gas configured to facilitate depositing the MMHM stack bulk layer 602; switching from the first reactive gas to the second reactive gas configured to facilitate depositing the MMHM stack bulk layer 702; and switching from the second reactive gas to the first reactive gas configured to facilitate depositing the MMHM stack bulk layer 802. In some embodiments of the invention, the single deposition chamber can be configured and arranged to utilize a physical vapor deposition process to form the alternating MMHM stack bulk layers 402, 502, 602, 702, 802. In some embodiments of the invention, the single deposition chamber can be configured and arranged to utilize PVD process to form the alternating MMHM stack bulk layers 402, 502, 602, 702, 802. In some embodiments of the invention, the single deposition chamber can be configured and arranged to utilize a CVD process to form the alternating MMHM stack bulk layers 402, 502, 602, 702, 802.

Figure 12:
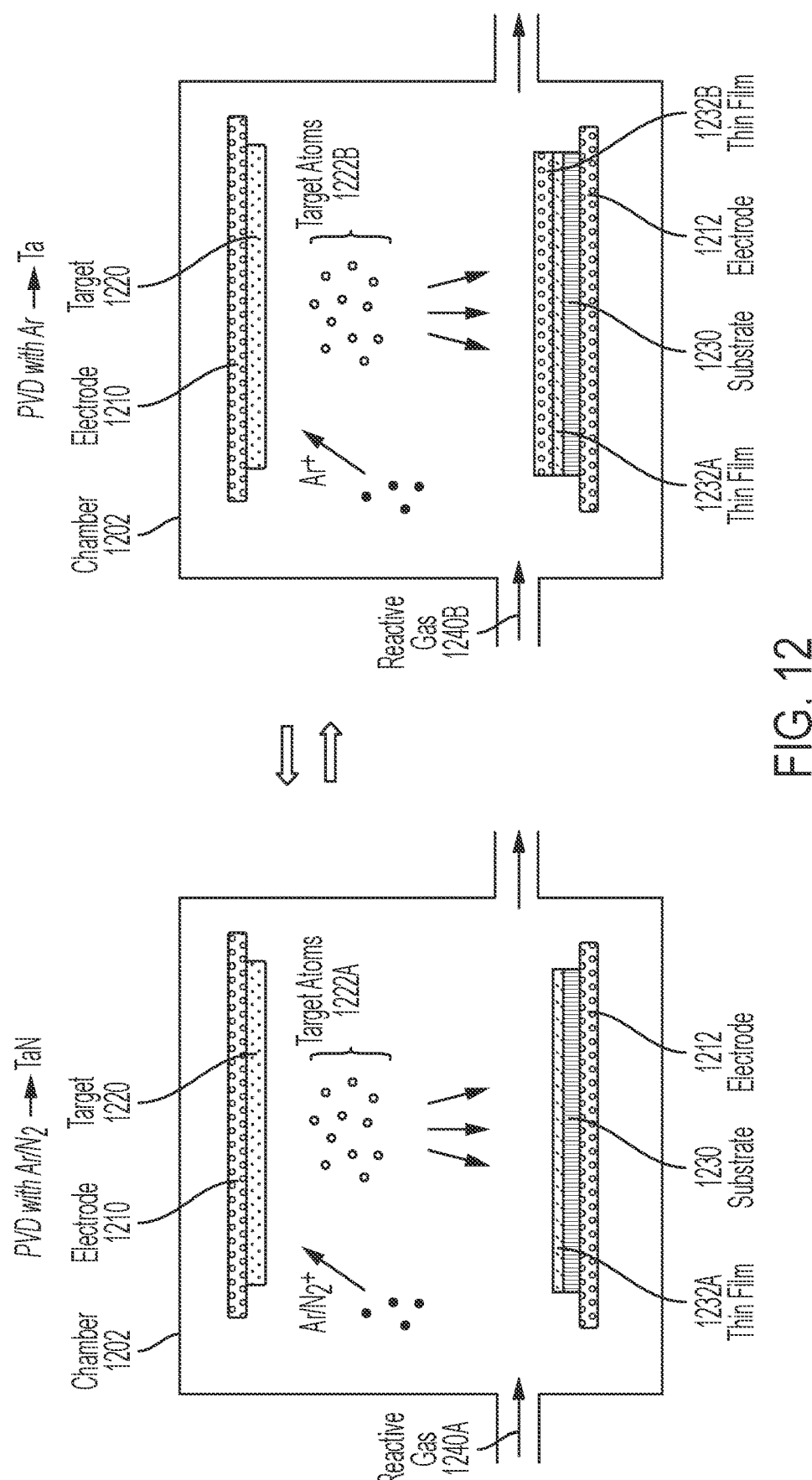
FIG. 12 depicts a block diagram illustrating a chamber that can be used to perform a non-sacrificial MMHM stack deposition in accordance with embodiments of the invention.

FIG. 12 depicts a non-limiting example of how the above-described single deposition chamber can be implemented as a chamber 1202. In the non-limiting example depicted in FIG. 12, the chamber 1202 is configured and arranged to, in accordance with aspects of the invention, execute a PVD process that switches between a reactive gas 1240A (shown in the leftmost instance of the chamber 1202) and a reactive gas 1240B (shown in the rightmost instance of the chamber 1202). The chamber 1202 includes an electrode 1210 configured to hold a target 1220, along with an electrode 1212 configured to hold a substrate 1230. In embodiments of the invention, the substrate 1230 is the IC 100 at the fabrication stage shown in FIG. 4. In operation, the chamber 1202 is a vacuum configured to accelerate the reactive gas 1240A to the target 1220 to dislodge target atoms 1222A from the target 1220 and toward the substrate 1230 to form the thin film 1232A. In embodiments of the invention, the target 1220 is or includes Ta; the reactive gas 1240A is Ar mixed with N$_2$; the dislodged (or sputtered) target atoms 1222A are Ta that react with N to form TaN; and the thin film 1232A is TaN. After a desired thickness of the thin film 1232A is reached, the chamber 1202 is switched from the reactive gas 1240A to the reactive gas 1240B (shown in the rightmost instance of the chamber 1202) to form the thin film 1232B over the thin film 1232A. In embodiments of the invention, the reactive gas 1240B is Ar; the sputtered target atoms 1222B are Ta; and the thin film 1232B is Ta. After a desired thickness of the thin film 1232B is reached, the chamber 1202 is switched from the reactive gas 1240B to the reactive gas 1240A (shown in the leftmost instance of the chamber 1202) to form another instance of the thin film 1232A over the thin film 1232B. The process depicted in FIG. 12 is repeated until the desired number and thicknesses of the thin films 1232A, 1232B are completed. In accordance with embodiments of the invention, the thin film 1232A corresponds to the MMHM stack bulk layers 402, 602, 802; and the thin film 1232B corresponds to the MMHM stack bulk layers 502, 702.

In some embodiments of the invention, the chamber 1202 can be configured to implement a CVD deposition process. In general, the key difference between PVD and CVD is that the target material in PVD is in solid form (e.g., target 1220) whereas in CVD the target material is in gaseous form. Accordingly, CVD sends the target material (specifically, chemical precursor material) into the chamber 1202 in the form of vapor at a certain temperature, and the reactive gases 1240A, 1240B (e.g., NH$_3$, H$_2$) react with the vapor phase target material (specifically, chemical precursor material) to react and/or decompose and deposit the target material (i.e., the solid reaction product of chemical precursor material vapor and reactive gas(es)) on the substrate 1230 or on a previously deposited thin film (e.g., thin film 1232A).

In accordance with embodiments of the invention, the MMHM stack bulk layers 402, 502, 602, 702, 802 have different compressive stress levels. In accordance with aspects of the invention, the MMHM stack bulk layers 402, 602, 802 each include a first compressive stress level, and the MMHM stack bulk layers 502, 702 each include a second compressive stress level that is less than the first compressive stress level. In accordance with aspects of the invention, the MMHM stack bulk layer 402 is adjacent the MMHM stack bulk layer 502, which means that the MMHM stack bulk layer 502 at the second compressive stress level has a subtractive effect on the first compressive stress level of the MMHM stack bulk layer 402. Accordingly, the first compressive stress level of the MMHM stack bulk layer 402 operating alone is greater than the compressive stress level of the combined MMHM stack bulk layers 402, 502. In accordance with aspects of the invention, the MMHM stack bulk layers 402, 602, 802 alternate with the MMHM stack bulk layers 502, 702 such that each of the MMHM stack bulk layers 402, 602, 802 is adjacent to at least one of the MMHM stack bulk layers 502, 702. In some embodiments of the invention, the MMHM stack bulk layers 402, 602, 802 can be formed from TaN, and the MMHM stack bulk layers 502, 702 can be formed from Ta. Because the compressive stress of Ta is about 50-70 percent of the compressive stress of TaN, the second compressive stress level is about 50-70 percent of the first compressive stress level. The thicknesses and the total number of the MMHM stack bulk layers 402, 502, 602, 702, 802 are selected such that a desired percentage of the total volume of the MMHM stack bulk layers 402, 502, 602, 702, 802 is provided by Ta at the second compressive stress level. The desired percentage of the total volume of the MMHM stack bulk layers 402, 502, 602, 702, 802 that is provided by Ta at the second compressive stress level is selected to achieve a desired reduction in the first compressive stress level, as well as to achieve a desired overall compressive stress level of each of the to-be-formed MMHM stacks 150, 150A (shown in FIGS. 9A and 9B). The thickness of each of the overall MMHM stacks 150, 150A is selected to provide the hardmask features that are necessary for forming the MTJ stack 140 from the bulk MTJ layers 302, 304, 306 (shown in FIGS. 9A-10B).

Figure 9B:
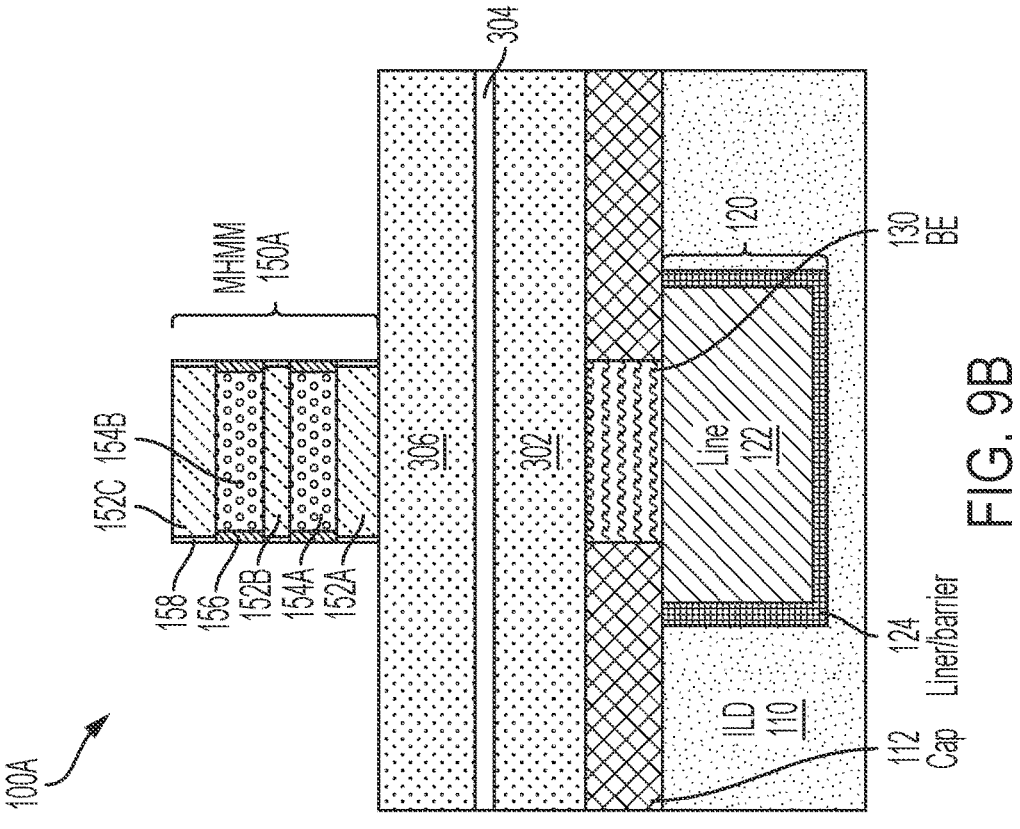
FIG. 9B depicts a cross-sectional view of the IC structure after fabrication operations for forming the IC structure shown in FIG. 1B according to embodiments of the invention.
Figure 9A:
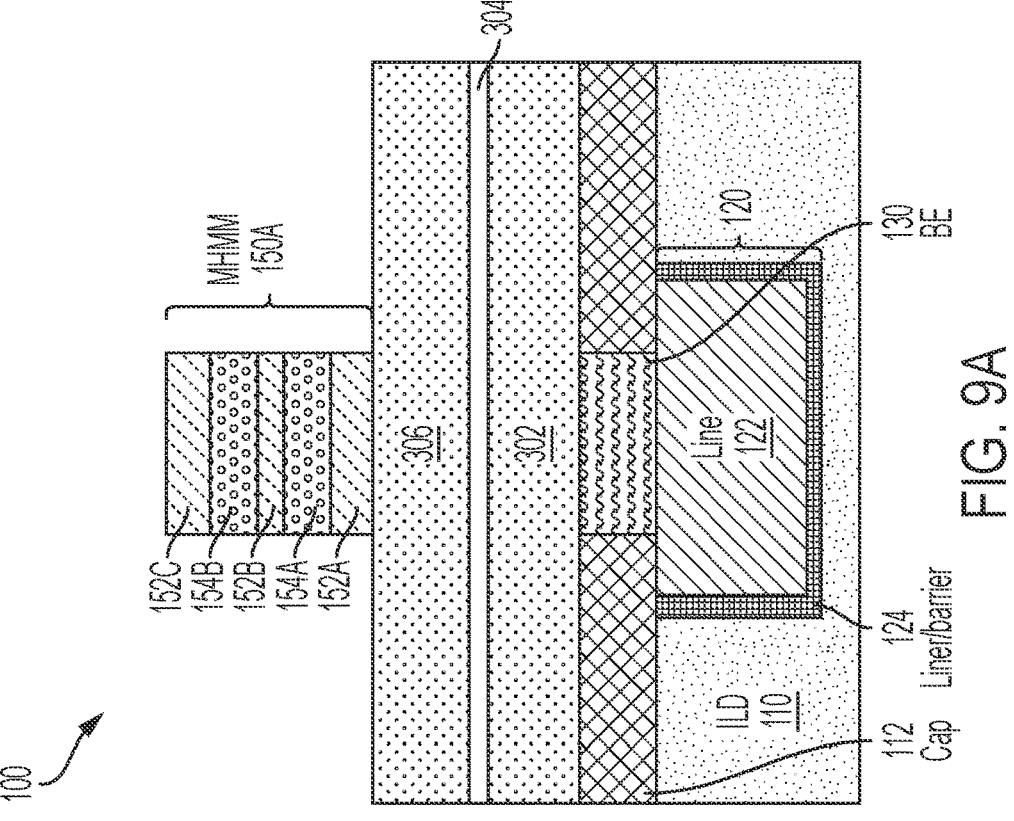
FIG. 9A depicts a cross-sectional view of the IC structure after fabrication operations for forming the IC structure shown in FIG. 1A according to embodiments of the invention.
Figure 10B:
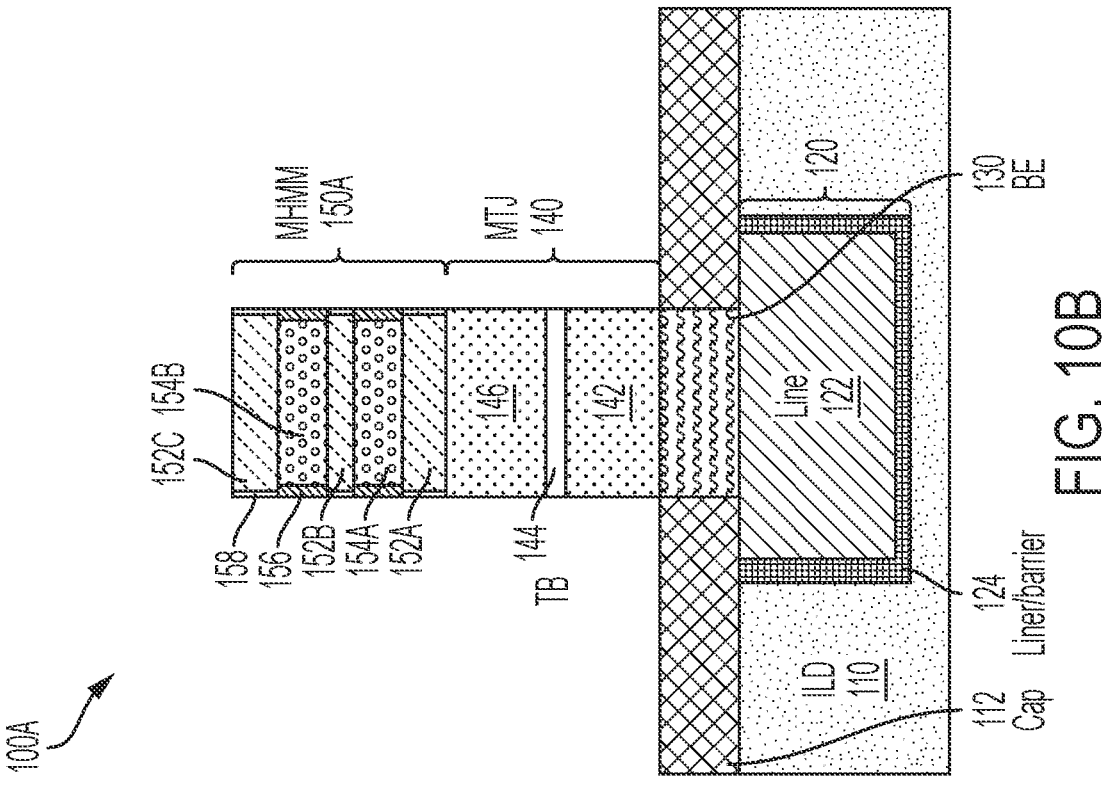
FIG. 10B depicts a cross-sectional view of the IC structure after fabrication operations for forming the IC structure shown in FIG. 1B according to embodiments of the invention.
Figure 10A:
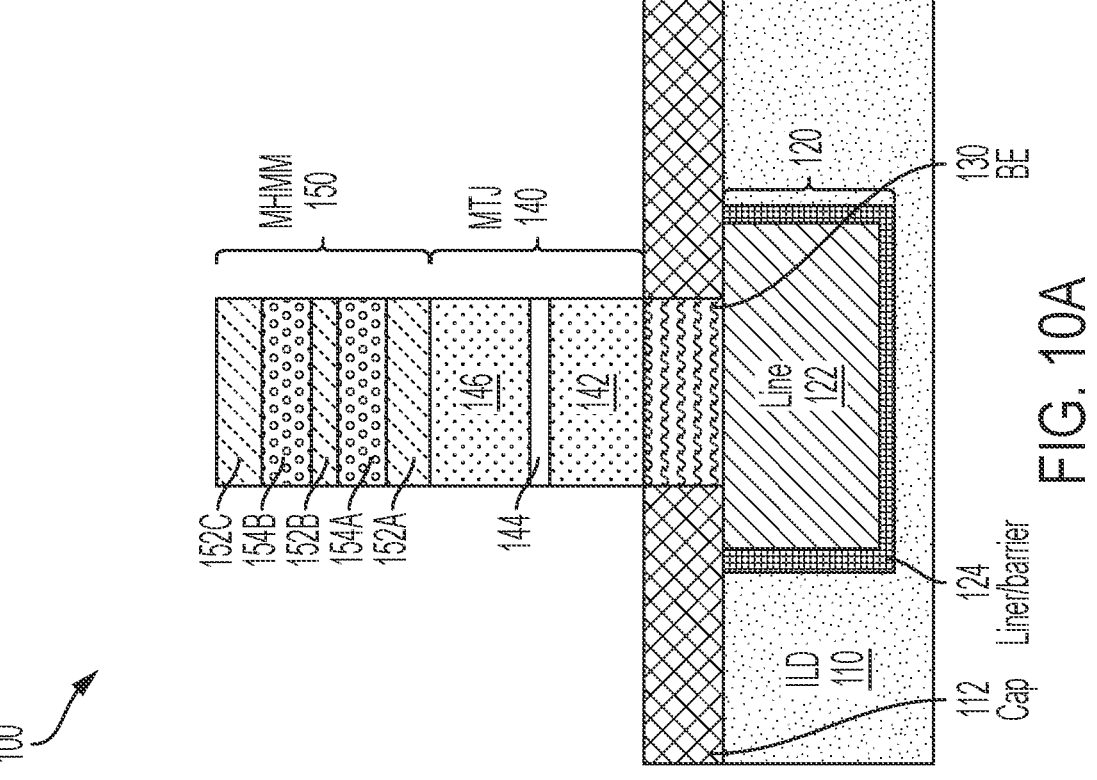
FIG. 10A depicts a cross-sectional view of the IC structure after fabrication operations for forming the IC structure shown in FIG. 1A according to embodiments of the invention.
Figure 11B:
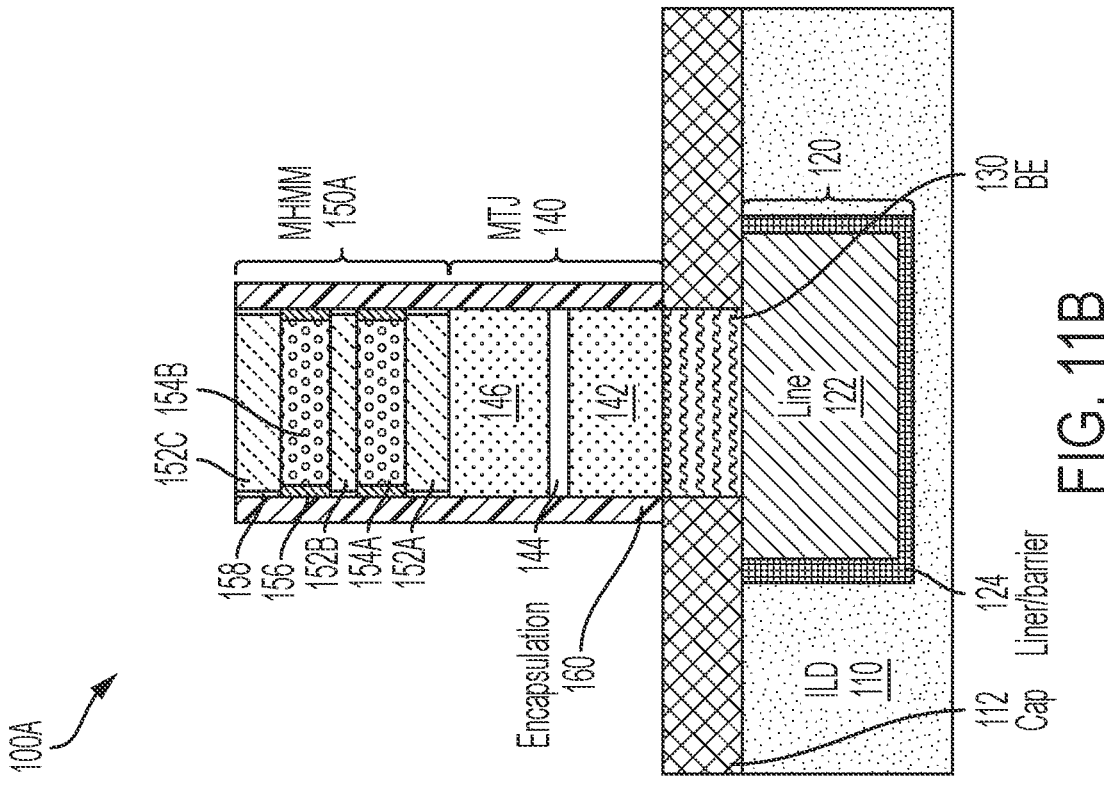
Figure 11A:
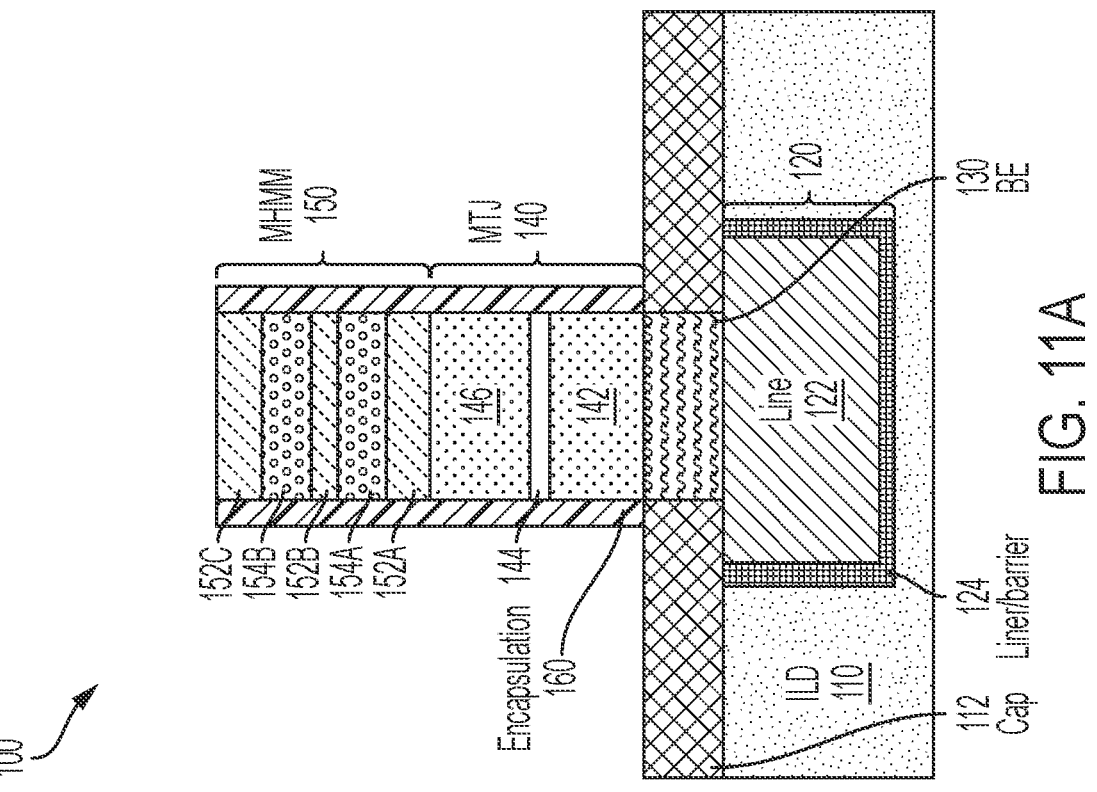
FIG. 11A depicts a cross-sectional view of the IC structure after fabrication operations for forming the IC structure shown in FIG. 1A according to embodiments of the invention.

FIGS. 9A, 10A, and 11A depict fabrication operations for forming the IC 100 (shown in FIG. 1A); and FIGS. 9B, 10B, and 11B depict fabrication operations for forming the IC 100A (shown in FIG. 1B). In FIG. 9A, known fabrication operations have been used to pattern and etch the MMHM stack bulk layers 402, 502, 602, 702, 802 (shown in FIG. 8) to form the MMHM stack 150. In FIG. 9B, in addition to the known fabrication operations that have been used to pattern and etch the MMHM stack bulk layers 402, 502, 602, 702, 802 (shown in FIG. 8), the protective dielectric regions 158 have been formed on sidewalls of the etched MMHM regions 152A, 152B, 152C; and the protective dielectric regions 156 have been formed on sidewalls of the etched MMHM regions 154A, 154B, which results in the MMHM stack 150A. In some embodiments of the invention, the protective dielectric regions 158 are formed by applying an oxidation process (e.g., by thermal/plasma exposure to O$_2$, H$_2$O and/or NO$_x$) to the sidewalls of the MMHM regions 152A, 152B, 152C; and the protective dielectric regions 156 are formed by applying an oxidation process (e.g., by thermal/plasma exposure to O$_2$, H$_2$O and/or NO$_x$) to the sidewalls of the MMHM regions 154A, 154B. In embodiments of the invention where the MMHM regions 152A,

152B, 152C are TaN, the oxidation process results in the protective dielectric regions 158 being formed from TaO$_x$N. In embodiments of the invention where the MMHM regions 154A, 154B are Ta, the oxidation process results in the protective dielectric regions 156 being formed from TaO$_x$. In FIG. 9A and in FIG. 9B, each of the MMHM stacks 150, 150A defines a desired footprint of the MTJ stack 140 (shown in FIGS. 1A, 1B) and exposes top surfaces of the MTJ stack bulk layers 306.

In FIGS. 10A and 10B, know fabrication operations have been used to etch through exposed surfaces of the MTJ stack bulk layers 306, 304, 302 (shown in FIGS. 9A and 9B) to form the MTJ stacks 140 that each track the footprint of its associated MMHM stack 150, 150A, respectively. The etching process applied to the MTJ stack bulk layers 306, 304, 302 stops at the bottom electrode 130, thereby exposing top surfaces of the bottom electrode 130 and the cap layer 112. The etching processes used to form the MTJ stack 140 can involve an aggressive directional etch (e.g., ion beam etch (IBE), or reactive ion etch (RIE)). In accordance with aspects of the invention, the protective dielectric regions 156, 158 prevent metal from being re-sputtered from the MMHM stack 150A onto sidewalls of the MTJ stack 140 (and particularly the tunnel barrier 144) when the MTJ stack 140 is being formed from the bulk MTJ layers 306, 304, 302. The re-sputtering can result from using the aggressive directional etch (e.g., IBE or RIE) to form the MTJ stack 140, and can cause short circuits by providing a direct current path between the free layer 142 and the fixed layer 146.

In FIGS. 11A and 11B, known fabrication operations have been used to form the encapsulation layer 160 on sidewalls of the MTJ stacks 140 and the MMHM stacks 150, 150A. In embodiments of the invention, the known fabrication operations used to form the encapsulation layer 160 can include conformally forming an encapsulation layer bulk material (not shown) over the IC 100, 100A, and more specifically over the exposed surfaces of the cap layer 112; along sidewalls of the MTJ stack 140 and the MMHM stacks 150, 150A; and over the MMHM stacks 150, 150A. A directional etch is used to remove the encapsulation layer bulk material from horizontal surfaces of the IC 100, 100A, thereby forming the encapsulation layer 160. In aspects of the invention, the encapsulation layer 160 can be formed from any suitable dielectric material (e.g., silicon nitride), which can include other elements such as Si, C, N, O, and the like.

After the fabrication operations depicted in FIGS. 11A and 11B, known fabrication operations are used to form the ILD 114 and the interconnect 170, thereby forming the IC 100 shown in FIG. 1A and the IC 100A shown in FIG. 1B.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. An integrated circuit (IC) structure comprising:
a memory element; and a non-sacrificial hardmask stack over the memory element;
wherein the non-sacrificial hardmask stack exhibits an overall compressive stress;
wherein the non-sacrificial hardmask stack comprises a first hardmask region and a second hardmask region;
wherein the first hardmask region exhibits a first compressive stress, and the second hardmask region exhibits a second compressive stress; and
wherein a level of the overall compressive stress is based at least in part on a level of the first compressive stress being greater than a level of the second compressive stress.

2. The IC structure of claim 1 further comprising a protective oxide region on a sidewall of the memory element.

3. The IC structure of claim 1, wherein the level of the overall compressive stress is less than the level of the first compressive stress.

4. The IC structure of claim 3, wherein the first hardmask region comprises a nitride of a metal.

5. The IC structure of claim 4, wherein the second hardmask region comprises the metal.

6. The IC structure of claim 1, wherein the non-sacrificial hardmask stack further comprises a third hardmask region that exhibits a third compressive stress.

7. The IC structure of claim 6, wherein a level of the third compressive stress is greater than the level of the second compressive stress.

8. The IC structure of claim 7, wherein thicknesses of the first hardmask region, the second hardmask region, and the third hardmask region are such that:
a desired percentage of a total volume of the non-sacrificial hardmask stack is provided by the second hardmask region;
a desired reduction in the level of the first compressive stress and the level of the third compressive stress is achieved; and
a desired level of the overall compressive stress is achieved.

9. The IC structure of claim 8, wherein:
the level of the first compressive stress is substantially the same as the level of the third compressive stress; and
the second hardmask region is between the first hardmask region and the third hardmask region.

10. The IC structure of claim 9, wherein the memory element comprises a magnetic tunnel junction (MTJ) stack.

11. An integrated circuit (IC) structure comprising:
a memory element; and
a non-sacrificial hardmask stack over the memory element;
wherein the non-sacrificial hardmask stack exhibits an overall compressive stress;
wherein the non-sacrificial hardmask stack comprises a plurality of first hardmask regions and a plurality of second hardmask regions;
wherein each of the plurality of first hardmask regions is adjacent to one of the plurality of second hardmask regions;
wherein each of the plurality of first hardmask regions exhibits a first compressive stress, and each of the plurality of second hardmask regions exhibits a second compressive stress; and
wherein a level of the overall compressive stress is based at least in part on a level of the first compressive stress being greater than a level of the second compressive stress.

12. The IC structure of claim 11 further comprising:

a protective oxide region on a sidewall of the memory element; and an encapsulation layer on the protective oxide;

wherein the protective oxide region and the encapsulation layer are different elements of the IC structure.

13. The IC structure of claim 11, wherein thicknesses of the plurality of first hardmask regions and the plurality of second hardmask regions are such that:

a desired percentage of a total volume of the non-sacrificial hardmask stack is provided by the plurality of second hardmask regions;

a desired reduction in the level of the first compressive stress by the level of the second compressive stress is achieved; and a desired value of the level of the overall compressive stress is achieved; and the level of the overall compressive stress is less than the level of the first compressive stress.

14. The IC structure of claim 13, wherein:

each of the plurality of first hardmask regions is formed from a nitride of a metal; and each of the plurality of second hardmask regions is formed from the metal.

15. The IC structure of claim 14, wherein the memory element comprises a magnetic tunnel junction (MTJ) stack.

16. A method of forming a portion of an integrated circuit (IC) structure, the method comprising:

forming a memory element; and forming a non-sacrificial hardmask stack over the memory element;

wherein the non-sacrificial hardmask stack exhibits an overall compressive stress;

wherein the non-sacrificial hardmask stack comprises a first hardmask region and a second hardmask region;

wherein the first hardmask region exhibits a first compressive stress, and the second hardmask region exhibits a second compressive stress; and wherein a level of the overall compressive stress is based at least in part on a level of the first compressive stress being greater than a level of the second compressive stress.

17. The method of claim 16 further comprising forming a protective oxide region on a sidewall of the memory element.

18. The method of claim 16, wherein thicknesses of the first hardmask region and the second hardmask region are such that:

a desired percentage of a total volume of the non-sacrificial hardmask stack is provided by the second hardmask region;

a desired reduction in the level of the first compressive stress is achieved due to the presence of the second hardmask region;

a desired value of the level of the overall compressive stress is achieved; and the level of the overall compressive stress is less than the level of the first compressive stress.

19. The method of claim 16, wherein:

the first hardmask region comprises a nitride of a metal; and the second hardmask region comprises the metal.

20. The method of claim 19, wherein forming the non-sacrificial hardmask stack includes applying a deposition process comprising:

placing the IC structure in a chamber;

using a first reactive gas to generate a first instance of the metal and deposit the first instance of the metal on the IC structure;

switching from the first reactive gas to a second reactive gas; and using the second reactive gas to generate a second instance of the metal, react the second instance of the metal with the nitride to generate the nitride of the metal, and deposit the nitride of the metal on the first instance of the metal that is on the IC structure.

* * * * *